United States Patent
Chen et al.

(10) Patent No.: US 10,903,105 B2
(45) Date of Patent: Jan. 26, 2021

(54) FLIP CHIP BONDING DEVICE AND BONDING METHOD

(71) Applicant: SHANGHAI MICRO ELECTRONICS EQUIPMENT (GROUP) CO., LTD., Shanghai (CN)

(72) Inventors: Feibiao Chen, Shanghai (CN); Yaping Ge, Shanghai (CN); Song Guo, Shanghai (CN); Jingchao Qi, Shanghai (CN)

(73) Assignee: Shanghai Micro Electronics Equipment (Group) Co., Ltd., Shanghai (CN)

( * ) Notice: Subject to any disclaimer, the term of this patent is extended or adjusted under 35 U.S.C. 154(b) by 344 days.

(21) Appl. No.: 16/080,426

(22) PCT Filed: Feb. 27, 2017

(86) PCT No.: PCT/CN2017/075033
§ 371 (c)(1),
(2) Date: Aug. 28, 2018

(87) PCT Pub. No.: WO2017/148353
PCT Pub. Date: Sep. 8, 2017

(65) Prior Publication Data
US 2020/0013656 A1 Jan. 9, 2020

(30) Foreign Application Priority Data
Feb. 29, 2016 (CN) .......................... 2016 1 0113099

(51) Int. Cl.
*H01L 21/68* (2006.01)
*H01L 21/50* (2006.01)
(Continued)

(52) U.S. Cl.
CPC ............ *H01L 21/681* (2013.01); *H01L 21/50* (2013.01); *H01L 21/67121* (2013.01);
(Continued)

(58) Field of Classification Search
CPC ... H01L 21/50; H01L 21/67; H01L 21/67121; H01L 21/67132; H01L 21/67144;
(Continued)

(56) References Cited

U.S. PATENT DOCUMENTS 6,311,391 B1   11/2001  Fuke et al.
2007/0039686 A1*  2/2007  Makino ............ H01L 21/67144
                                                156/249
(Continued)

FOREIGN PATENT DOCUMENTS

CN      201522998 U    7/2010
CN      103000558 A    3/2013
(Continued)

*Primary Examiner* — Peter Dungba Vo
*Assistant Examiner* — Joshua D Anderson
(74) *Attorney, Agent, or Firm* — Muncy, Geissler, Olds & Lowe, P.C.

(57) ABSTRACT

A flip-chip bonding device and method are disclosed. The bonding device includes: a supply unit (10) for separating a flip-chip (200) from a carrier (100) and providing the flip-chip (200), the supply unit (10) including flipping device (11); a transfer unit (20) for receiving the flip-chip (200) from the flipping device (11); a position adjustment unit (30) for adjusting the positions of flip-chips (200) on the transfer unit (20); a bonding unit (40) for bonding the flip-chips (200) on the transfer unit (20) onto a substrate (400); a transportation unit (50) for transporting the transfer unit (20); and a control unit (60) for controlling the movement of the preceding units. The transfer unit (20) is capable of receiving multiple flip-chips (200) and allows the flip-chips (200) to be bonded simultaneously. This can result in savings in bonding time and an improvement in throughput.

(Continued)

Moreover, during the transportation of the transfer unit (20), the positions of the flip-chips (200) thereon can be adjusted by the position adjustment unit (30), thereby ensuring high positional accuracy of the flip-chips (200) in the subsequent bonding step. As a result, a high-accuracy bonding can be achieved.

12 Claims, 4 Drawing Sheets

(51) Int. Cl.
    *H01L 21/67* (2006.01)
    *H01L 21/673* (2006.01)
    *H01L 21/683* (2006.01)
    *H05K 13/08* (2006.01)
    *H05K 13/04* (2006.01)

(52) U.S. Cl.
    CPC .... *H01L 21/67333* (2013.01); *H01L 21/6838* (2013.01); *H05K 13/0408* (2013.01); *H05K 13/0452* (2013.01); *H05K 13/0478* (2013.01); *H05K 13/081* (2018.08); *H05K 13/0409* (2018.08); *Y10T 29/53178* (2015.01); *Y10T 29/53252* (2015.01)

(58) Field of Classification Search
    CPC ......... H01L 21/67155; H01L 21/67173; H01L 21/67333; H01L 21/67703; H01L 21/67721; H01L 21/681; H01L 21/683; H01L 21/6838; H01L 21/68742; H01L 21/68778; H05K 13/0015; H05K 13/022; H05K 13/028; H05K 13/04; H05K 13/0408; H05K 13/0409; H05K 13/041; H05K 13/0417; H05K 13/0452; H05K 13/0478; H05K 13/0482; H05K 13/0495; H05K 13/081; H05K 13/0812; Y10T 29/4913; Y10T 29/49131; Y10T 29/53174; Y10T 29/53178; Y10T 29/53187; Y10T 29/53191; Y10T 29/53252; Y10T 29/53261; Y10T 29/53265

See application file for complete search history.

(56) References Cited

U.S. PATENT DOCUMENTS

| | | | |
|---|---|---|---|
| 2010/0000081 A1* | 1/2010 | Noda | H01L 24/75 29/739 |
| 2010/0257727 A1* | 10/2010 | Hiraki | H01L 21/67144 29/729 |
| 2013/0167369 A1* | 7/2013 | Oh | H01L 21/67144 29/740 |
| 2018/0033658 A1* | 2/2018 | Maijala | H01L 21/67144 |

FOREIGN PATENT DOCUMENTS

| | | |
|---|---|---|
| CN | 103367208 A | 10/2013 |
| CN | 103576467 A | 2/2014 |
| CN | 104078373 A | 10/2014 |
| CN | 104183527 A | 12/2014 |
| CN | 104701199 A | 6/2015 |
| JP | 2000164640 A | 6/2000 |
| JP | 2004179523 A | 6/2004 |
| JP | 2010016271 A | 1/2010 |
| JP | 2012028587 A | 2/2012 |
| JP | 2015130414 A | 7/2015 |
| KR | 101425613 B1 | 8/2014 |
| KR | 10-1456138 B1 | 11/2014 |
| WO | WO2003058708 A1 | 7/2003 |
| WO | WO2006011563 A1 | 2/2006 |

* cited by examiner

FLIP CHIP BONDING DEVICE AND BONDING METHOD

TECHNICAL FIELD

The present invention relates to the field of semiconductor technology and, in particular, to a flip-chip bonding device and method.

BACKGROUND

Flip-chip bonding is an interconnection approach for bonding a chip to a substrate. With the development of electronic products toward light weight, slimness and miniaturization, chip bonding techniques are gaining increasing use. When combined with a wafer-level packaging process, a chip bonding process allows the fabrication of smaller packages with higher performance. Moreover, with known good dies (KGDs), a chip bonding process in combination with a through-silicon via (TSV) process makes it possible to manufacture three-dimensional structures that are more competitive in terms of cost and performance.

A conventional flip-chip bonding apparatus picks up a single chip from a chip feeder with a suction head sized comparably to the chip, aligns an alignment mark on the chip with an alignment mark on the substrate to which the chip is to be bonded with the aid of an alignment system and presses the chip down onto the substrate to form an interconnection between the chip and the substrate. This process is conducted in a serial manner and, if the press bonding cycle lasts for a long time, the overall throughput will be too low to allow the process to be used for mass production. In addition, the bonding accuracy of this process is low.

FIG. 1 schematically illustrates a flip-chip bonding process. As shown in FIG. 1, chips 2 to be bonded, which are carried on a support table 1 with their component sides 3 facing upward, are picked up and flipped over by a mechanical arm and then bonded to a substrate 4 at a pitch L that is adjustable based on the requirements of the practical process. This conventional flip-chip bonding approach is more specifically shown in FIG. 2. At first, a flipping mechanical arm 5 picks up a chip from the support table 1, flips it over and passes it on to another mechanical arm 6 which then transports the chip to above the substrate 4. After alignment is effected between an alignment mark on the front side of the chip and an alignment mark on the substrate 4 by a CCD image sensor 7, the chip is pressed down onto and thereby bonded to the substrate. This approach is, however, disadvantageous in that the whole process is carried out in a serial manner in which the chips are bonded consecutively one by one. In scenarios in which the pressing and bonding of each chip takes a relatively long time (e.g., 30 seconds), the throughput will be too low to allow the approach to be used for mass production.

SUMMARY OF THE INVENTION

It is an object of the present invention to provide a flip-chip bonding device and method which allow simultaneous bonding of multiple flip-chips with high accuracy, thereby resulting in savings in bonding time and an improvement in process throughput.

The above and other related objects are attained by a flip-chip bonding device according to the present invention, which comprises: a supply unit, configured to separate a flip-chip from a carrier and to supply the flip-chip, the supply unit comprising a flipping device for picking up and flipping over the flip-chip separated from the carrier so that the flip-chip is turned downside up;

a transfer unit configured to receive and retain the flip-chip from the flipping device, the transfer unit being able to retain multiple flip-chips;

a position adjustment unit, configured to adjust the positions of flip-chips on the transfer unit;

a bonding unit, configured to bond the flip-chips on the transfer unit onto a substrate;

a transportation unit, configured to transport the transfer unit in a horizontal X-direction; and a control unit, configured to control movements of the respective units, wherein the supply unit, the position adjustment unit and the bonding unit are disposed sequentially along the horizontal X-direction.

Optionally, the supply unit may further comprise a jack device configured to raise a flip-chip from the carrier so that the flip-chip is separated from the carrier and is located higher than the carrier and wherein the flipping device is able to pick up the flip-chip.

Optionally, the jack device may comprise, connected sequentially along a vertical Z-direction, a plunger mechanism, a first absorption mechanism and a first moving mechanism, the plunger mechanism configured to raise the flip-chip; the first absorption mechanism configured to absorb, in a direction which is opposite to a direction in which the flip-chip is raised, the carrier on which the flip-chips are placed, the first moving mechanism configured to move the plunger mechanism and the first absorption mechanism.

Optionally, the flipping device may comprise a motor, a second moving mechanism, a connecting member for connecting the motor to the second moving mechanism, and a second absorption mechanism that is connected to the second moving mechanism in a vertical Z-direction, the second absorption mechanism configured to absorb the flip-chip, the second moving mechanism configured to move the second absorption mechanism in the vertical Z-direction, the motor configured to flip over the second absorption mechanism and the second moving mechanism.

Optionally, the position adjustment unit may comprise a first measurement system and a position adjustment device, the first measurement system configured to measure the positions of the flip-chips on the transfer unit, the position adjustment device configured to adjust the positions of the flip-chips on the transfer unit.

Optionally, the position adjustment device may comprise a support mechanism, a third moving mechanism and a third absorption mechanism, the support mechanism configured to support the third moving mechanism, the third moving mechanism configured to move the third absorption mechanism to a location corresponding to one of the flip-chips on the transfer unit, the third absorption mechanism configured to absorb the flip-chip from the transfer unit.

Optionally, the bonding unit may comprise a second measurement system and a third measurement system, the second measurement system configured to measure a position of the transfer unit, the third measurement system configured to measure a position of the substrate.

Optionally, each of the first measurement system, the second measurement system and the third measurement system may be configured to obtain a position of an object through measuring a position of a mark provided on the object and comprise a first measure branch and a second measure branch, the first measure branch comprising a first illumination unit and a first detector unit, the first illumination unit configured to serve as an illumination light source for the mark, the first detector unit configured to accordingly image the mark and measure the position of the mark, the second measure branch comprising a second illumination unit and a second detector unit, the second illumination unit being structurally identical to the first illumination unit, the second detector unit being structurally identical to the first detector unit, the mark comprising an X-direction feature and a Y-direction feature that are oriented orthogonal to each other, the first measure branch configured to measure a position of the X-direction feature, the second measure branch configured to measure a position of the Y-direction feature.

Optionally, a projection of an optical axis of the first measure branch on the mark may be parallel to the Y-direction feature, with a projection of an optical axis of the second measure branch on the mark parallel to the X-direction feature.

Optionally, the first illumination unit may comprise a broadband light source, an illumination lens group and an imaging front lens group, wherein the first detector unit comprises an imaging rear lens group and an image sensor, wherein broadband light emanated from the broadband light source successively passes through the illumination lens group and the imaging front lens group and is then obliquely incident on the X-direction or Y-direction feature, wherein light reflected from the X-direction or Y-direction feature propagates through the imaging rear lens group, thereby, imaging the mark on the image sensor, and wherein after processing an image output from the image sensor, positional information of the mark is obtain.

Optionally, the supply unit may further comprise a first motion stage, and the bonding unit further comprises a second motion stage, the first motion stage configured to carry the carrier that is configured to supply the flip-chips to the transfer unit, the second motion stage configured to carry the substrate that is to be bonded to the flip-chips on the transfer unit.

Optionally, the flip-chip bonding device may further comprise a carrier holder unit, a substrate holder unit, a first transfer device and a second transfer device, the carrier holder unit configured to support multiple carriers for supplying flip-chips to be bonded, the substrate holder unit configured to support multiple substrates that have completed chip bonding, the first transfer device configured to pick up one of the carriers from the carrier holder unit and place transfer the carrier onto the first motion stage, the second transfer unit configured to pick up the substrate from the second motion stage and transfer the substrate to the substrate holder unit.

The present invention also provides a corresponding flip-chip bonding method, comprising the steps of:

S01: separating, a supply unit, a flip-chip from a carrier and picking up and flipping over the flip-chip by a flipping device;

S02: receiving, by a transfer unit, the flip-chip from the flipping device; S03: repeating steps S01 and S02 until the transfer unit has received and retained all the flip-chips;

S04: transporting, by a transportation unit, the transfer unit into a measurement field of a position adjustment unit, wherein the position adjustment unit measures and adjusts positions of the flip-chips on the transfer unit; and S05: transporting, by the transportation unit, the transfer unit to a measurement field of the bonding unit, wherein the bonding unit bonds all the flip-chips on the transfer unit onto a substrate.

Optionally, in step S01, a first transfer device may pick up the carrier from a carrier holder unit and transfers the carrier onto a first motion stage, followed by the first motion stage moving the flip-chips on the carrier to a predefined pick-up position, a jack device raising the flip-chips from the carrier and the flipping device picking up the flip-chips raised by the jack device and flipping over the flip-chips.

Optionally, in step S04, a first measurement system in the position adjustment unit may measure the positions of the flip-chips on the transfer unit, and a position adjustment device in the position adjustment unit adjusts the positions of the flip-chips on the transfer unit based on a measurement result of the first measurement system.

Optionally, in step S04, the first measurement system may carry out a measurement of the positions of the flip-chips on the transfer unit, and the transportation unit may transport, based on the measurement, the transfer unit into a fine measurement field of the position adjustment unit, wherein the first measurement system carries out another measurement of the positions of the flip-chips on the transfer unit and a position adjustment device adjusts the positions of the flip-chips on the transfer unit based on the another second measurement.

Optionally, in step S05, a second measurement system in the bonding unit may measure a position of the transfer unit, followed by the third measurement system measuring a position of the substrate, based on measurement results, the transportation unit transporting the transfer unit to a bonding position of the bonding unit and a second motion stage carrying the substrate to a bonding position of the bonding unit, to complete bonding of the flip-chips.

Optionally, the flip-chip bonding method may further comprise, subsequent to step S05, separating the flip-chips from the transfer unit and transferring the transfer unit back to an initial position by the transportation unit.

Optionally, the flip-chip bonding method may further comprise, after completion of bonding for the whole substrate, picking up and transferring the substrate into a substrate holder unit by a second transfer unit.

Compared to the prior art, the flip-chip bonding device and method according to the present invention have the following beneficial effects:

1. The transfer unit capable of receiving and retaining multiple flip-chips and the transportation unit capable of transporting the transfer unit to the bonding unit for simultaneous bonding of the multiple flip-chips can result in savings in bonding time and an improvement in throughput. Moreover, during the transportation of the transfer unit, the positions of the flip-chips on the transfer unit can be adjusted by the position adjustment unit, thereby ensuring a high positional accuracy of the flip-chips in the subsequent bonding step. As a result, a high-accuracy bonding can be achieved.

2. With the jack device comprising a plunger mechanism and a first absorption mechanism provided in the supply unit, the first absorption mechanism absorbs a carrier, the plunger mechanism raises a flip-chip from the carrier. In this way, it is easy to separate a flip-chip from the carrier, and the flipping device is avoided from fetching it directly from the carrier. This can prevent a delay in the picking up of the flip-chip and hence enhance the efficiency.

3. With the measurement system incorporating two illumination units and two detector units, the first illumination unit cooperates with the first detector unit to detect a position of the X-direction feature, and the second illumination unit works together with the second detector unit to detect a position of a Y-direction feature. As such, the X-direction and Y-direction features are measured separately, preventing crosstalk between the vertical and horizontal measuring signals and improving measurement accuracy.

DETAILED DESCRIPTION

The present invention will become more apparent and better understood from the following detailed description of specific Embodiments, which is to be read in connection with the accompanying drawings. Of course, the invention is not limited to these Embodiments and all general substitutions known to those skilled in the art are intended to be also embraced in the scope of the invention.

In addition, the drawings are presented in a schematic manner generally not drawn to scale, for the sake of facilitated illustration, and do not limit the scope of the present invention in any sense.

The core concept of the present invention is to provide a flip-chip bonding device comprising a transfer unit capable of receiving and retaining multiple flip-chips and a transportation unit capable of transporting the transfer unit to a bonding unit for simultaneous bonding of the multiple flip-chips, thereby resulting in savings in bonding time and an improvement in throughput. Moreover, during the transportation of the transfer unit, the positions of the flip-chips on the transfer unit can be adjusted by a position adjustment unit, thereby ensuring a high positional accuracy of the flip-chips in the subsequent bonding step. As a result, a high-accuracy bonding can be achieved.

Embodiment 1

Figure 1:
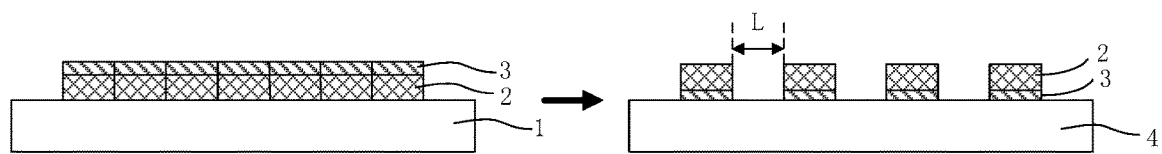
FIG. 1 schematically shows a conventional flip-chip bonding process.
Figure 2:
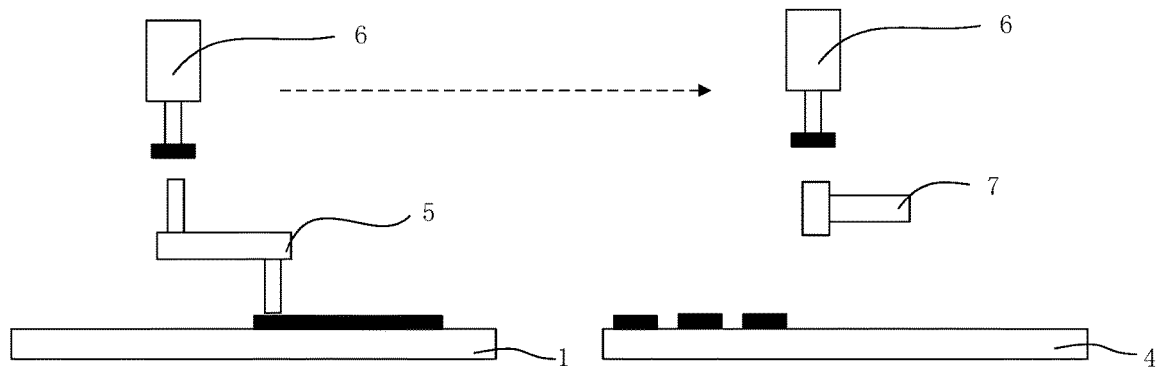
FIG. 2 is a schematic illustration of the conventional flip-chip bonding solution.
Figure 3:
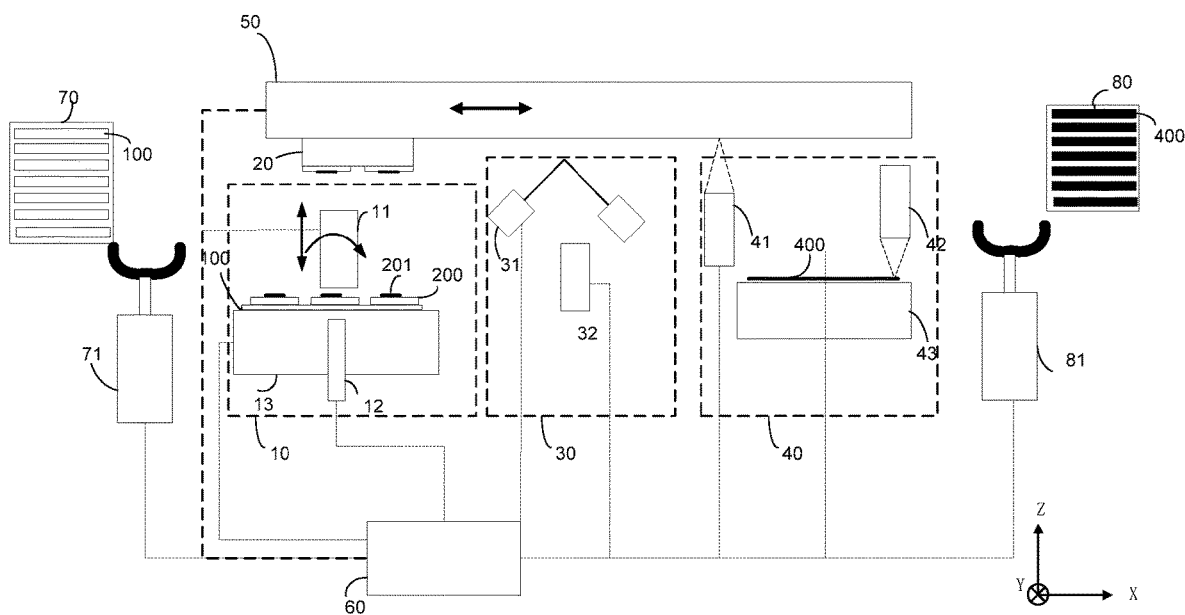
FIG. 3 shows a structural schematic of a flip-chip bonding device constructed in accordance with Embodiment 1 of the present invention.

Reference is now made to FIG. 3, which provides a structural schematic of a flip-chip bonding device constructed in accordance with Embodiment 1 of the present invention. As shown in FIG. 3, the flip-chip bonding device includes: a supply unit 10, configured to separate a flip-chip from a carrier 100 and supply the flip-chip, the supply unit 10 comprising a flipping device 11 for picking up and flipping over the flip-chip so that the flip-chip is turned downside up; a transfer unit 20, configured to receive the flip-chip from the flipping device 11 and retain it, the transfer unit 20 being able to retain multiple flip-chips; a position adjustment unit 30, configured to adjust the positions of flip-chips on the transfer unit 20; a bonding unit 40, configured to bond the flip-chips on the transfer unit 20 onto a substrate 400; and a transportation unit 50, configured to transport the transfer unit 20 in the X-direction. The supply unit 10, the position adjustment unit 30 and the bonding unit 40 are disposed sequentially along the X-direction. A control unit 60 is also included, which is configured to control the movement of the aforementioned units. On the carrier 100 are placed a set of flip-chips each provided with a chip mark. In FIG. 3, only one of the flip-chips and its chip mark are indicated at 200 and 201, respectively.

In the flip-chip bonding device according to the present invention, the transfer unit is capable of receiving and retaining multiple flip-chips from the supply unit. The transportation unit is capable of transporting the transfer unit to the bonding unit for the bonding of the multiple flip-chips and the multiple flip-chips can be simultaneously bonded, thereby resulting in savings in bonding time and an improvement in throughput. Moreover, during the transportation of the transfer unit, the positions of the flip-chips thereon can be adjusted by a position adjustment unit, thereby ensuring a high positional accuracy of the flip-chips in the subsequent bonding step. As a result, a high-accuracy bonding can be achieved.

Figure 4:
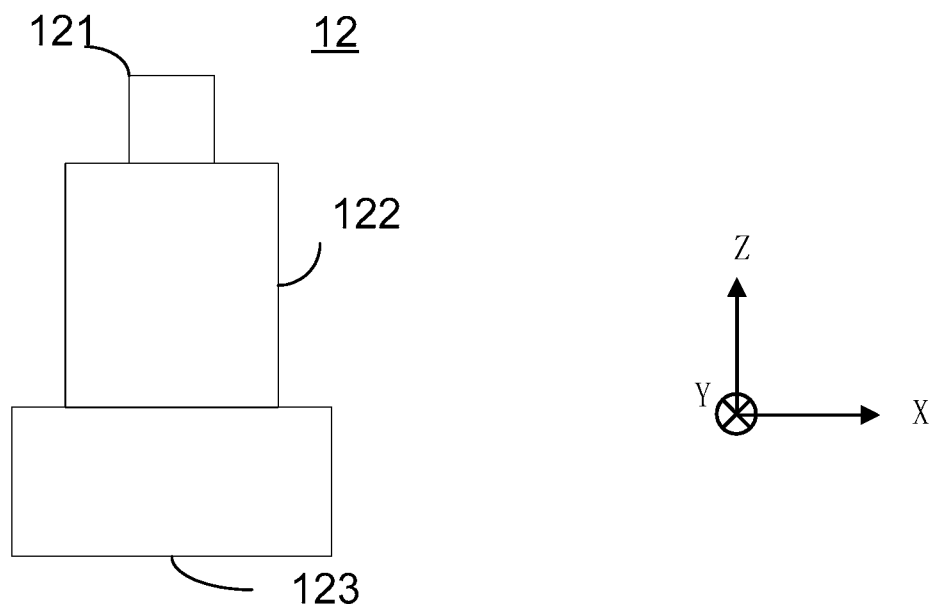
FIG. 4 shows a structural schematic of a jack device in Embodiment 1 of the present invention.

The supply unit 10 may include a jack device 12 configured to raise a flip-chip from the carrier 100 to a certain height with respect to the surface of the carrier 100. FIG. 4 shows a structural schematic of the jack device in Embodiment 1 of the present invention. As shown in FIG. 4, the jack device 12 may include a plunger mechanism 121, a first absorption mechanism 122 and a first moving mechanism 123 connected sequentially along the Z-direction. The plunger mechanism 121 is configured to raise the flip-chip. The first absorption mechanism 122 is configured to absorb, in a direction which is opposite to a direction in which the flip-chip is raised, the carrier on which the flip-chip is placed. The first moving mechanism 123 is configured to move the plunger mechanism 121 and the first absorption mechanism 122 in the Y-direction so as to make the jack device 12 move to a position of a next flip-chip.

Figure 5:
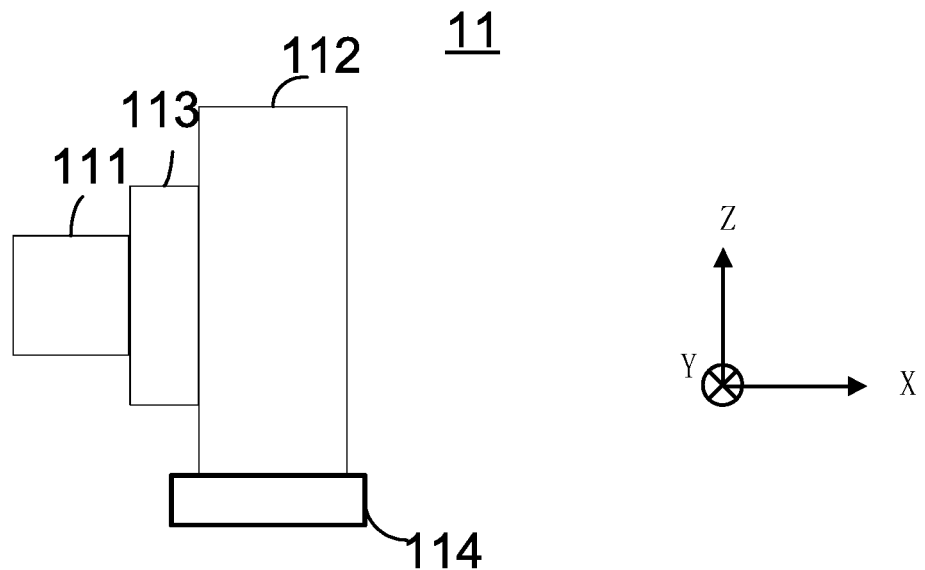
FIG. 5 shows a structural schematic of a flipping device in Embodiment 1 of the present invention.

The flipping device 11 is adapted to pick up the flip-chip raised by the jack device 12. FIG. 5 shows a structural schematic of the flipping device in Embodiment 1 of the present invention. As shown in FIG. 5, the flipping device 11 may include a motor 111, a second moving mechanism 112, a connecting member 113 connecting the motor 111 to the second moving mechanism 112, and a second absorption mechanism 114 connected to the second moving mechanism 112 in the Z-direction. The second absorption mechanism 114 is configured to absorb the flip-chip. The second moving mechanism 112 is configured to move the second absorption mechanism 114 in the Z-direction. The motor 111 is configured to cause flip over of the second absorption mechanism 114 and the second moving mechanism 112. The second absorption mechanism 114 may be implemented as a rubber suction cup, a ceramic suction cup or any other suction cup that can absorb the flip-chip.

In the supply unit 10, after the carrier is absorbed on the first absorption mechanism 122, the plunger mechanism 121 raises a flip-chip from the carrier 100. In this way, it is easy to raise a flip-chip from the carrier. Additionally, by picking up the flip-chip from the plunger mechanism 121 by the second absorption mechanism 114, the flipping device 11 is avoided from fetching it directly from the carrier 100. This can prevent a delay in the picking up of the flip-chip and hence enhance the working efficiency.

The position adjustment unit 30 may include a first measurement system 31 and position adjustment device 32. The first measurement system 31 is configured to measure the position of flip-chips on the transfer unit 20, and the position adjustment device 32 is configured to adjust the positions of the flip-chips on the transfer unit 20. The bonding unit 40 may include a second measurement system 41 and a third measurement system 42. The second measurement system 41 is configured to measure the position of the transfer unit 20, and the third measurement system 42 to measure the position of the substrate 400. The substrate 400 may be made of a metallic material, a semiconductor material, an organic material or other materials known to those skilled in the art.

Figure 6:
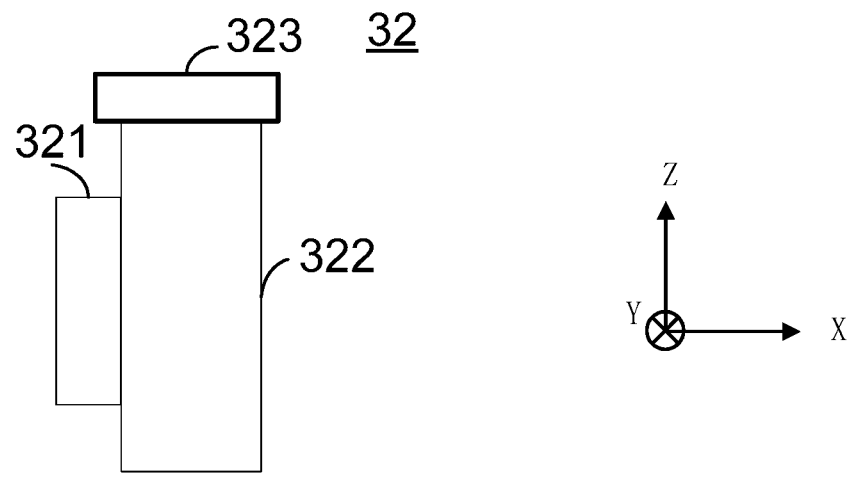
FIG. 6 shows a structural schematic of a position adjustment device in Embodiment 1 of the present invention.

FIG. 6 shows a structural schematic of the position adjustment device 32 in Embodiment 1 of the present invention. As shown in FIG. 6, the position adjustment device 3 may include a support 321, a third moving mechanism 322 and a third absorption mechanism 323. The support mechanism 321 is configured to support the third moving mechanism 322. The third moving mechanism 322 is configured to move the third absorption mechanism 323 to a location corresponding to absorbing a flip-chip on the transfer unit 20, and the third absorption mechanism 323 is configured to absorb the flip-chip from the transfer unit 20.

The first measurement system 31, the second measurement system 41 and the third measurement system 42 have the same structure and are all adapted to obtain positional information of an object from positional information of a mark on the object. The first measurement system 31 is capable of inferring the position of a flip-chip from a measurement of the position of a chip mark on the flip-chip. The second measurement system 41 can obtain the position of the transfer unit 20 by measuring the positions of chip marks (flip-chips retained on the transfer unit 20). The third measurement system 42 is able to detect the position of a substrate through measuring the positions of substrate marks on the substrate. The first measurement system 31 is disposed at such a position that a focal plane of the first measurement system 31 coincides with the chip mark on the flip-chip. In this Embodiment, the first measurement system 31 and the second measurement system 41 are both positioned under the transfer unit 20, while the third measurement system 42 is disposed above the substrate 400. In other words, both of the first measurement system 31 and the second measurement system 41 measure marks above them, while the third measurement system 42 measures marks under it. Due to the same structure of these three measurement systems, only the structure of the first measurement system 31 is detailed below.

Figure 7:
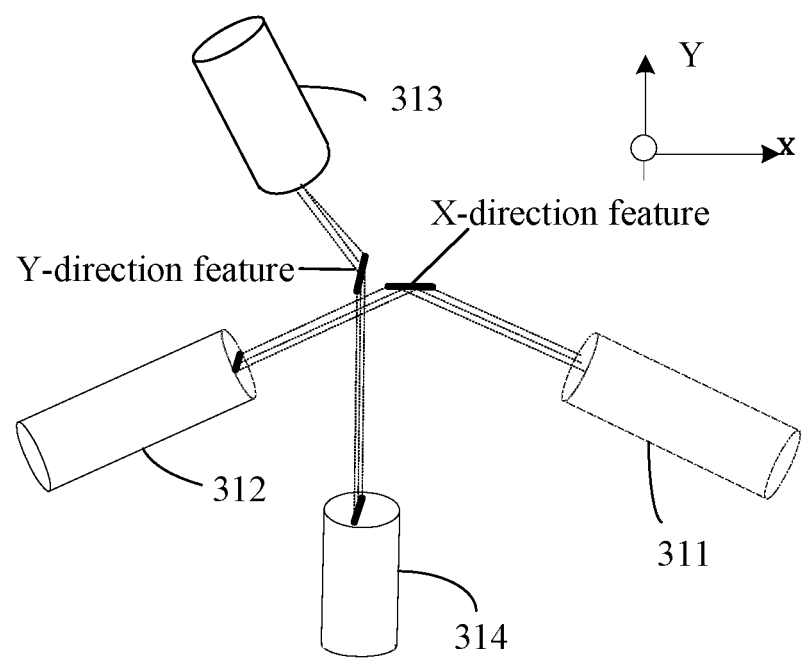
FIG. 7 shows a structural schematic of a first measurement system in Embodiment 1 of the present invention.

FIG. 7 shows a structural schematic of the first measurement system 31 in Embodiment 1 of the present invention. As shown in FIG. 7, the first measurement system 31 may include a first measure branch and a second measure branch. The first measure branch includes a first illumination unit 311 and a first detector unit 312. The first illumination unit 311 is configured to serve as an illumination light source for a mark and the first detector unit 312 to image the mark and measure its position. The second measure branch includes a second illumination unit 313 and a second detector unit 314. The second illumination unit 313 and the second detector unit 314 are identical to the first illumination unit 311 and the first detector unit 312, respectively. Each mark includes an X-direction feature and a Y-direction feature that is oriented orthogonal to each other. The first measure branch is designed to measure the position of the X-direction feature and the second measure branch to measure the position of the Y-direction feature. In other words, the first illumination unit 311 cooperates with the first detector unit 312 to detect the position of the X-direction feature, while the second illumination unit 313 works together with the second detector unit 314 to detect the position of the Y-direction feature. The first illumination unit 311 is configured to serve as an illumination light source for the X-direction feature, and the second illumination unit 312 to serve as an illumination light source for the Y-direction feature. The first detector unit 312 is provided to image the X-direction feature and measure its position and the second detector unit 314 to image the Y-direction feature and measure its position.

The first illumination unit 311 and the first detector unit 312 are disposed in symmetry with respect to the X-direction feature. Similarly, the second illumination unit 313 and the second detector unit 314 are disposed in symmetry with respect to the Y-direction feature. Measuring the X-direction and Y-direction features separately can prevent crosstalk between the vertical and horizontal measuring signals and provide improved measurement accuracy. A projection of an optical axis of the first measure branch on the mark is parallel to the Y-direction feature. Similarly, a projection of an optical axis of the second measure branch on the mark is parallel to the X-direction feature. These two orthogonal branches enable alignment and detection in the two directions.

Figure 8:
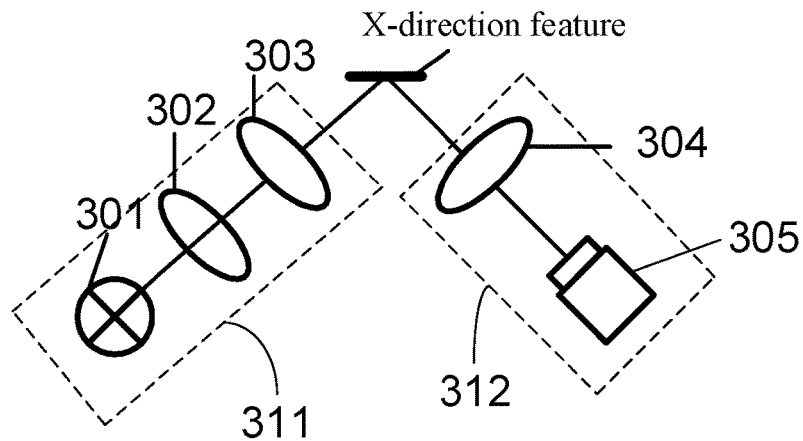
FIG. 8 is a diagram schematically illustrating a first illumination unit and a first detector unit in Embodiment 1 of the present invention.

FIG. 8 is a diagram schematically illustrating the first illumination unit 311 and the first detector unit 312 in Embodiment 1 of the present invention. As shown in FIG. 8, the first illumination unit 311 may include a broadband light source 301, an illumination lens group 302 and a front imaging lens group 303. The first detector unit 312 may include a rear imaging lens group 304 and an image sensor 305. Broadband light emanated from the broadband light source 301 successively passes through the illumination lens group 302 and the front imaging lens group 303 and is then obliquely incident on the X-direction feature. The light reflected from the X-direction feature propagates through the rear imaging lens group 304 and forms an image of the X-direction feature on the image sensor 305. In response, the image sensor 305 outputs an image which is processed to determine an alignment position for the feature. As the first illumination unit 311 is identical in terms of structure to the second illumination unit 313, and the first detector unit 312 is identical in terms of structure to the second illumination unit 313 and the second detector unit 314, the second illumination unit 313 and the second detector unit 314 will not be described in further detail herein.

With continued reference to FIG. 3, the supply unit 10 may further include a first motion stage 13, and the bonding unit 40 further comprises a second motion stage 43. The first motion stage 13 is configured to carry the carrier 100 that is used to feed flip-chips to the transfer unit 20. The second motion stage 43 is configured to carry the substrate 400 that is to be bonded to the flip-chips on the transfer unit 20.

The flip-chip bonding device may further include a carrier holder unit 70, a substrate holder unit 80, a first transfer device 71 and a second transfer unit 81. The carrier holder unit 70 is configured to accommodate multiple carriers 100 each carrying flip-chips to be bonded. The substrate holder unit 80 is configured to supply multiple substrates 400 that have completed the chip bonding. The first transfer device 71 is configured to pick up a carrier 100 from the carrier holder unit 70 and transfer it onto the first motion stage 13. The second transfer unit 81 is configured to pick up a substrate 400 from the second motion stage 43 and transfer it into the substrate holder unit 80.

The control system 60 is configured to control movement of the above-described units and devices. Specifically, under the control of the control system 60, the first transfer device 71 is able to pick up a carrier 100 and transfer it to the first motion stage 13. Under the control of the control system 60, the first motion stage 13 is able to move in multiple degrees of freedom. Under the control of the control system 60, the flipping device 11 is able to move in the Z-direction and flip over a flip-chip. Under the control of the control system 60, the transportation unit 50 is able to move in the X-direction. Under the control of the control system 60, the first measurement system 31 is able measure the position of a flip-chip. Under the control of the control system 60, the position adjustment device 32 is able to move in multiple degrees of freedom to adjust the position of a flip-chip. Under the control of the control system 60, the second measurement system 41 is able to measure the position of the transfer unit 20. Under the control of the control system 60, the third measurement system 42 is able to measure the position of a substrate 400. Under the control of the control system 60, the second motion stage 43 is able to move in multiple degrees of freedom, and under the control of the control system 60, the second transfer unit 81 is able to pick up a substrate and transfer it to the substrate holder unit 80. According to the present invention, for each of the first motion stage 13, the transportation unit 50 and the second motion stage 43, the number of degrees of freedom in which it is movable can be determined according to the practical need.

In the flip-chip bonding device of the present invention, the use of the transfer unit 20 sized smaller than the substrate for temporary retention and transfer of flip-chips can enhance the adaptability to different processes. The size of the transfer unit 20 may be determined based on the practical flip-chip size, and the layout of flip-chips on the transfer unit may be properly designed based on the size, pitch and number of the flip-chip and margins of the transfer unit. According to the present invention, comprehensive optimization and configuration is possible according to the throughput and cost requirements through incorporating multiple identical instances of the position adjustment unit 30 and multiple identical instances of the position adjustment device 32 for measuring and adjusting the positions of multiple flip-chips on the transfer unit in parallel at the same time.

Embodiment 2

Figure 9:
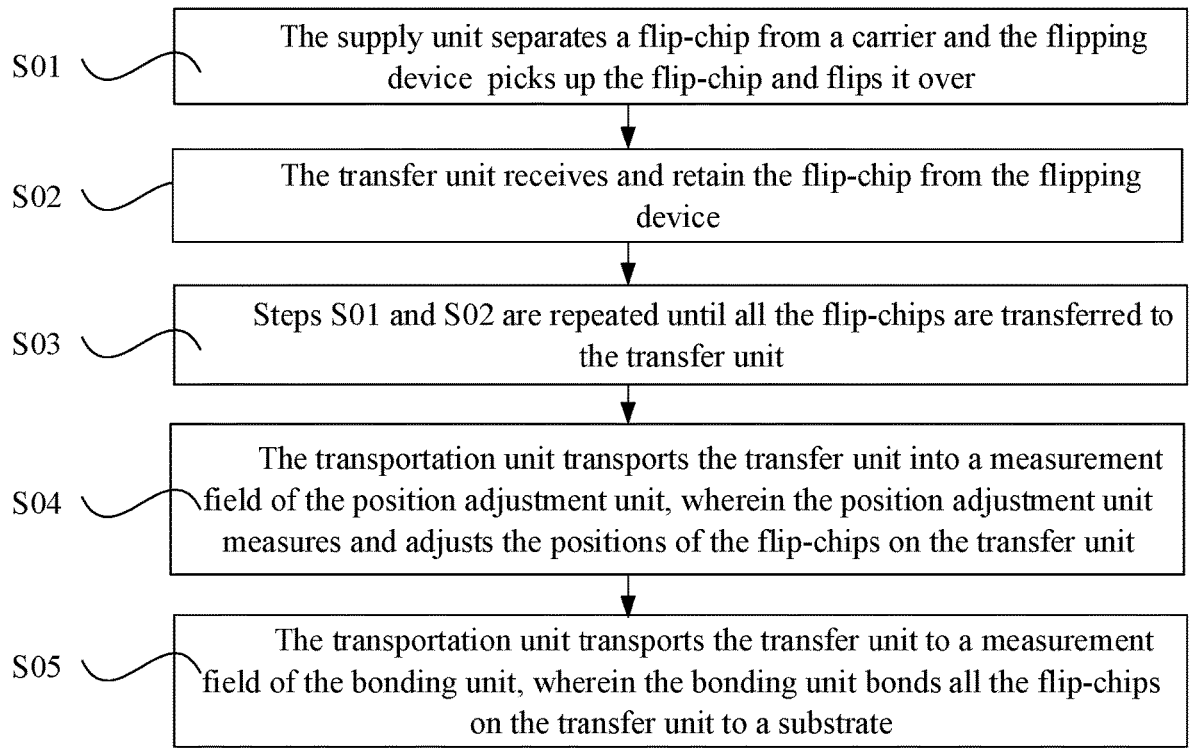
FIG. 9 is a flowchart graphically illustrating a flip-chip bonding method according to Embodiment 2 of the present invention.

FIG. 9 is a flowchart graphically illustrating a flip-chip bonding method according to Embodiment 2 of the present invention. As shown in FIG. 9, the flip-chip bonding method includes the following steps.

In step S01, the supply unit 10 separates a flip-chip from a carrier 100 and the flipping device 11 picks up the flip-chip and flips it over.

In step S02, the transfer unit 20 receives and retains the flip-chip from the flipping device 11.

In step S03, steps S01 and S02 are repeated until completing receiving and retaining all the flip-chips for the transfer unit 20.

In step S04, the transportation unit 50 transports the transfer unit 20 into a measurement field of the position adjustment unit 30, where the position adjustment unit 30 measures and adjusts the positions of the flip-chips on the transfer unit 20.

In step S05, the transportation unit 50 transports the transfer unit 20 to a measurement field of the bonding unit 40, where the bonding unit 40 bonds all the flip-chips on the transfer unit onto the substrate 400.

Specifically, in step S01, the first transfer device 71 picks up the carrier 100 from the carrier holder unit 70 and transfers it onto the first motion stage 13. The first motion stage 13 moves the flip-chip on the carrier 100 to a predefined pick up position. The jack device 12 then raises the flip-chip with respect to the carrier 100 to allow the flipping device 11 to pick up the flip-chip from the jack device 12. The flipping device 11 then flips the flip-chip over.

In step S02, the transfer unit 20 receives and retains the flip-chip from the flipping device 11.

In step S03, steps S01 and S02 are repeated until completing receiving and retaining all the flip-chips for the transfer unit 20.

In step S04, the transportation unit 50 transports the transfer unit 20 into the measurement field of the position adjustment unit 30, where the position adjustment unit 30 measures and adjusts the positions of the flip-chips on the transfer unit 20. Step S04 may further include the following sub-steps.

In a first sub-step, the transportation unit 50 transports the transfer unit 20 into the measurement field of the position adjustment unit 30. In a second sub-step, the first measurement system 31 in the position adjustment unit 30 measures the positions of the flip-chips on the transfer unit 20. In a third sub-step, the position adjustment device 32 in the position adjustment unit 30 adjusts the positions of the flip-chips on the transfer unit 20 based on the measured data. Optionally, subsequent to the second sub-step, the transportation unit 50 may transport, based on the measurement performed by the first measurement system 31, the transfer unit 20 into a fine measurement field of the position adjustment unit 30, followed by repetition of the second sub-step. Step S04 may be repeated at least once, preferably twice, so as to facilitate the adjustment of the positions of the flip-chips on the transfer unit 20.

In step S05, the transportation unit 50 transports the transfer unit 20 to the measurement field of the bonding unit 40, where the bonding unit 40 bonds all the flip-chips on the transfer unit onto the substrate 400. Step S05 may further include the sub-steps of:

measuring the position of the transfer unit 20 by the second measurement system 41 in the bonding unit 40; measuring the position of the substrate 400 by the third measurement system 42; moving, by the transportation unit 50, the transfer unit 20 to a bonding position of the bonding unit 40 based on measured data; moving, by the second motion stage 43, the substrate 400 to a bonding position of the bonding unit 40; and bonding the flip-chips to the substrate 400.

The flip-chip bonding method of the present invention may further include, in step S06, subsequent to the separation of the flip-chips from the transfer unit 20, returning the transfer unit 20 to the initial position by the transportation unit 50. In this Embodiment, the initial position is above the supply unit 10. Steps S01 to S06 may be repeated until bonding for whole piece of the substrate 400 completed. Then, the second transfer unit 81 may pick up the substrate 400 and transfer it to the substrate holder unit 80.

In the flip-chip bonding method of the present invention, the transportation unit transports the transfer unit among the supply unit, the position adjustment unit and the bonding unit so that flip-chips are loaded onto the transfer unit from the supply unit, adjusted in terms of their positions on the transfer unit by the position adjustment unit and bonded to the substrate by the bonding unit. As multiple flip-chips are handled by the transfer unit at the same time, the time required for the bonding is shortened and the throughput is improved. Moreover, the positional adjustment ensures high positional accuracy of the flip-chips in the subsequent bonding step. As a result, a high-accuracy bonding can be achieved.

In summary, in the flip-chip bonding device and method of the present invention, the transfer unit capable of receiving and retaining multiple flip-chips and the transportation unit capable of transporting the transfer unit to the bonding unit for their simultaneous bonding can result in savings in bonding time and an improvement in throughput. Moreover, during the transportation of the transfer unit, the positions of the flip-chips on transfer unit can be adjusted by the position adjustment unit, thereby ensuring high positional accuracy of the flip-chips in the subsequent bonding step. As a result, a high-accuracy bonding can be achieved. Further, with the jack device in the supply unit, after a carrier is retained on the first absorption mechanism, the plunger mechanism raises a flip-chip from the carrier. In this way, it is easy to separate a flip-chip from the carrier, and the flipping device is avoided from fetching it directly from the carrier. This can prevent a delay in the picking up of the flip-chip and hence enhance the working efficiency. Furthermore, with the measurement system incorporating the two illumination units and two detector units, the first illumination unit cooperates with the first detector unit to detect the position of the X-direction feature, and the second illumination unit works together with the second detector unit to detect the position of the Y-direction feature. As such, the X-direction and Y-direction features are measured separately, preventing crosstalk between the vertical and horizontal measuring signals and improving measurement accuracy.

The description presented above is merely that of some preferred embodiments of the present invention and does not limit the scope thereof in any sense. Any and all changes and modifications made by those of ordinary skill in the art based on the above teachings fall within the scope as defined in the appended claims.

What is claimed is:

1. A flip-chip bonding device, comprising:
   a supply unit configured to separate a flip-chip from a carrier and to supply the flip-chip, the supply unit comprising a separation device configured to separate the flip-chip from the carrier and a flipping device configured to pick up and flip over the flip-chip separated from the carrier so that the flip-chip is turned downside up;
   a transfer unit configured to receive and retain the flip-chip turned downside up from the flipping device, the transfer unit being configured to retain multiple flip-chips received from the flipping device;
   a bonding unit configured to simultaneously bond the multiple flip-chips on the transfer unit onto a substrate;
   a transportation unit configured to transport the transfer unit in a horizontal X-direction from the supply unit to the bonding unit; and
   a position adjustment unit configured to measure the positions of the multiple flip-chips retained on the transfer unit and adjust positions of the multiple flip-chips during the transportation of the transfer unit from the supply unit to the bonding unit, the position adjustment unit comprising a position adjustment device configured to absorb the flip-chips and adjust the positions of the flip-chips on the transfer unit to ensure a high positional accuracy of the flip-chips when bonded to the substrate by the bonding unit;
   a control unit configured to control movements of the supply unit, transfer unit, position adjustment unit, bonding unit, and transportation unit,
   wherein the supply unit, the position adjustment unit and the bonding unit are disposed sequentially along the horizontal X-direction.

2. The flip-chip bonding device of claim 1, wherein the separation device of the supply unit comprises a jack device configured to raise a flip-chip from the carrier so that the flip-chip is separated from the carrier and is located higher than the carrier, and wherein the flipping device is able to pick up the raised flip-chip.

3. The flip-chip bonding device of claim 2, wherein the jack device comprises a plunger mechanism, a first absorption mechanism and a first moving mechanism connected sequentially along a vertical Z-direction,
   the plunger mechanism configured to raise the flip-chip,
   the first absorption mechanism configured to absorb, in a direction which is opposite to a direction in which the flip-chip is raised, the carrier on which the flip-chips are placed,
   the first moving mechanism configured to move the plunger mechanism and the first absorption mechanism.

4. The flip-chip bonding device of claim 1, wherein the flipping device comprises a motor, a second moving mechanism, a connecting member for connecting the motor to the second moving mechanism, and a second absorption mechanism that is connected to the second moving mechanism in a vertical Z-direction,
   the second absorption mechanism configured to absorb the flip-chip,
   the second moving mechanism configured to move the second absorption mechanism in the vertical Z-direction,
   the motor configured to flip over the second absorption mechanism and the second moving mechanism.

5. The flip-chip bonding device of claim 1, wherein the position adjustment unit comprises a first measurement system and the position adjustment device,
   the first measurement system configured to measure the positions of the flip-chips on the transfer unit,
   the position adjustment device configured to adjust the positions of the flip-chips on the transfer unit.

6. The flip-chip bonding device of claim 5, wherein the position adjustment device comprises a support mechanism, a third moving mechanism and a third absorption mechanism,
   the support mechanism configured to support the third moving mechanism,
   the third moving mechanism configured to move the third absorption mechanism to a location corresponding to one of the flip-chips on the transfer unit,
   the third absorption mechanism configured to absorb the flip-chip from the transfer unit.

7. The flip-chip bonding device of claim 5, wherein the bonding unit comprises a second measurement system and a third measurement system,
   the second measurement system configured to measure a position of the transfer unit,
   the third measurement system configured to measure a position of the substrate.

8. The flip-chip bonding device of claim 7, wherein each of the first measurement system, the second measurement system and the third measurement system is configured to obtain a position of an object through measuring a position of a mark provided on the object and comprises a first measure branch and a second measure branch, the first measure branch comprising a first illumination unit and a first detector unit, the first illumination unit configured to serve as an illumination light source for the mark, the first detector unit configured to accordingly image the mark and measure the position of the mark, the second measure branch comprising a second illumination unit and a second detector unit, the second illumination unit being structurally identical to the first illumination unit, the second detector unit being structurally identical to the first detector unit, the mark comprising an X-direction feature and a Y-direction feature that are oriented orthogonal to each other, the first measure branch configured to measure a position of the X-direction feature, the second measure branch configured to measure a position of the Y-direction feature.

9. The flip-chip bonding device of claim 8, wherein a projection of an optical axis of the first measure branch on the mark is parallel to the Y-direction feature, and wherein a projection of an optical axis of the second measure branch on the mark is parallel to the X-direction feature.

10. The flip-chip bonding device of claim 8, wherein the first illumination unit comprises a broadband light source, an illumination lens group and a front imaging lens group, wherein the first detector unit comprises a rear imaging lens group and an image sensor, wherein broadband light emanated from the broadband light source successively passes through the illumination lens group and the front imaging lens group and is then obliquely incident on the X-direction or Y-direction feature, wherein light reflected from the X-direction or Y-direction feature propagates through the rear imaging lens group, thereby imaging the mark on the image sensor, and wherein after processing an image output from the image sensor, positional information of the mark is obtain.

11. The flip-chip bonding device of claim 1, wherein the supply unit further comprises a first motion stage, and the bonding unit further comprises a second motion stage, the first motion stage configured to carry the carrier that is configured to supply the flip-chips to the transfer unit;

the second motion stage configured to carry the substrate that is to be bonded to the flip-chips on the transfer unit.

12. The flip-chip bonding device of claim 11, further comprising a carrier holder unit, a substrate holder unit, a first transfer device and a second transfer device, the carrier holder unit configured to support multiple carriers for supplying flip-chips to be bonded, the substrate holder unit configured to support multiple substrates that have completed chip bonding, the first transfer device configured to pick up one of the carriers from the carrier holder unit and transfer the carrier onto the first motion stage, the second transfer unit configured to pick up the substrate from the second motion stage and transfer the substrate to the substrate holder unit.

* * * * *